United States Patent
Gopalakrishnan et al.

(10) Patent No.: US 11,372,795 B2
(45) Date of Patent: *Jun. 28, 2022

(54) MEMORY WITH ALTERNATIVE COMMAND INTERFACES

(71) Applicant: Rambus Inc., San Jose, CA (US)

(72) Inventors: Liji Gopalakrishnan, Sunnyvale, CA (US); Ian Shaeffer, Los Gatos, CA (US); Yi Lu, San Jose, CA (US)

(73) Assignee: Rambus Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/942,970

(22) Filed: Jul. 30, 2020

(65) Prior Publication Data

US 2021/0011876 A1   Jan. 14, 2021

Related U.S. Application Data

(63) Continuation of application No. 16/520,137, filed on Jul. 23, 2019, now Pat. No. 10,747,703, which is a (Continued)

(51) Int. Cl.
*G06F 13/40* (2006.01)
*G11C 7/10* (2006.01)
(Continued)

(52) U.S. Cl.
CPC ...... *G06F 13/4068* (2013.01); *G06F 13/1673* (2013.01); *G06F 13/1678* (2013.01);
(Continued)

(58) Field of Classification Search
CPC ............ G06F 13/4068; G06F 13/1673; G06F 13/1678; G11C 5/04; G11C 7/1012; G11C 7/1039; G11C 7/1045; G11C 7/1075; G11C 11/4093; G11C 11/4094; G11C 11/4096; Y02D 10/00
See application file for complete search history.

(56) References Cited

U.S. PATENT DOCUMENTS 5,896,395 A   4/1999 Lee
6,889,304 B2   5/2005 Perego et al.
(Continued)

OTHER PUBLICATIONS

Malviya, D., et al., "Module Threading Technique to Improve DRAM Power and Performance," Design and Reuse S.A., 2009 (c), Mar. 11, 2011. 9 pages.
(Continued)

*Primary Examiner* — Hiep T Nguyen
(74) *Attorney, Agent, or Firm* — Silicon Edge Law Group LLP; Arthur J. Behiel

(57) ABSTRACT

A memory device or module selects between alternative command ports. Memory systems with memory modules incorporating such memory devices support point-to-point connectivity and efficient interconnect usage for different numbers of modules. The memory devices and modules can be of programmable data widths. Devices on the same module can be configured select different command ports to facilitate memory threading. Modules can likewise be configured to select different command ports for the same purpose.

20 Claims, 5 Drawing Sheets

Related U.S. Application Data continuation of application No. 15/647,983, filed on Jul. 12, 2017, now Pat. No. 10,380,056, which is a continuation of application No. 15/051,282, filed on Feb. 23, 2016, now Pat. No. 9,734,112, which is a continuation of application No. 13/952,530, filed on Jul. 26, 2013, now Pat. No. 9,275,699.

(60) Provisional application No. 61/684,437, filed on Aug. 17, 2012.

(51) Int. Cl.
    *G11C 11/4093*      (2006.01)
    *G11C 11/4094*      (2006.01)
    *G11C 5/04*      (2006.01)
    *G06F 13/16*      (2006.01)
    *G11C 11/4096*      (2006.01)

(52) U.S. Cl.
    CPC .............. *G11C 5/04* (2013.01); *G11C 7/1012* (2013.01); *G11C 7/1039* (2013.01); *G11C 7/1045* (2013.01); *G11C 7/1075* (2013.01); *G11C 11/4093* (2013.01); *G11C 11/4094* (2013.01); *G11C 11/4096* (2013.01); *Y02D 10/00* (2018.01)

(56) References Cited

U.S. PATENT DOCUMENTS

| | | |
|---|---|---|
| 7,082,075 B2 | 7/2006 | Skidmore |
| 7,610,447 B2 | 10/2009 | Perego et al. |
| 7,613,883 B2 | 11/2009 | Bellows et al. |
| 7,660,183 B2 | 2/2010 | Ware et al. |
| 7,769,942 B2 | 8/2010 | Ware et al. |
| 8,024,642 B2 | 9/2011 | Lastras-Montano |
| 8,028,144 B2 | 9/2011 | Hampel et al. |
| 8,069,379 B2 | 11/2011 | Perego et al. |
| 8,193,953 B1 * | 6/2012 | Krishnamurthy ....... H03M 7/28 341/60 |
| 8,769,213 B2 | 7/2014 | Skinner et al. |
| 9,158,715 B1 | 10/2015 | Bromberg |
| 9,275,699 B2 | 3/2016 | Gopalakrishnan et al. |
| 10,747,703 B2 * | 8/2020 | Gopalakrishnan ........................... G11C 11/4093 |
| 2004/0133736 A1 | 7/2004 | Kyung |
| 2004/0186956 A1 | 9/2004 | Perego et al. |
| 2005/0007835 A1 | 1/2005 | Lee et al. |
| 2006/0026349 A1 | 2/2006 | Gower et al. |
| 2006/0117155 A1 | 6/2006 | Ware et al. |
| 2006/0120169 A1 * | 6/2006 | Tsumura .............. G11C 7/1045 365/189.02 |
| 2006/0259666 A1 | 11/2006 | Lee |
| 2007/0162656 A1 | 7/2007 | Bryan et al. |
| 2007/0300018 A1 | 12/2007 | Campbell et al. |
| 2008/0183959 A1 | 7/2008 | Pelley et al. |
| 2010/0106917 A1 | 4/2010 | Ruberg et al. |
| 2010/0185811 A1 | 7/2010 | Kwon |
| 2010/0262790 A1 | 10/2010 | Perego et al. |
| 2015/0089164 A1 | 3/2015 | Ware et al. |

OTHER PUBLICATIONS

Rambus Inc., "Micro-Threading," http://www.rambus.com/us/technology/innovations/detail/microthreading.html, Mar. 3, 2011. 4 pages.

Ware, F., et al., "Micro-threaded Row and Column Operations in a DRAM Core," Rambus White Paper, Mar. 2005. 7 pages.

* cited by examiner

MEMORY WITH ALTERNATIVE COMMAND INTERFACES

BACKGROUND

Processing units (PUs) execute instructions to read, manipulate, and write data. Both the instructions and data are commonly stored in a separate memory, which is coupled to the PU via a communication channel. In a common example, a personal computer (PC) normally includes a central processing unit (CPU) coupled to a quantity of dynamic, random-access memory (DRAM) via a channel called a "memory bus."

The speed at which a PU can process instructions depends in part on how fast the memory is able to read and write instructions and data, which in turn depends in part on the speed with which signals can be communicated over the memory bus. Faster computers ideally employ faster memory buses, so a considerable amount of resources have been expended improving the speed performance of memory buses.

Memory buses are commonly "multi-drop," which means that a number of memory devices can share the same channel. Multi-drop buses are desirable because they allow manufactures and users the flexibility to provide different types and amounts of memory. However, multi-drop buses tend to degrade signals, and thus reduce speed performance. An alternative to multi-drop buses, so-called "point-to-point" connections, directly connect the PU to the one or more memories, and thus avoid signal degradation that results from bus sharing. One problem with these systems is that point-to-point connection resources are wasted unless the memory system has the maximum number of memories. In a topology that supports two memory modules, for example, half the point-to-point interconnects would be wasted in a one-module configuration.

The assignee of the instant application developed "Dynamic Point-to-Point (DPP)" memory-bus topologies that allow manufacturers and computer users the flexibility to provide different numbers of memory modules in a manner similar to multi-drop buses but without the wasted connection resources that can result in conventional point-to-point topologies. In DPP topologies, the same number of point-to-point connections can be used for different numbers of memories. Most memories and memory systems do not support DPP connectivity, and thus lack the benefits of these systems. There is therefore a need for simple and inexpensive means for speeding the adoption of this important technology.

BRIEF DESCRIPTION OF THE FIGURES

The figures are illustrations by way of example, and not by way of limitation. Like reference numerals in the figures refer to similar elements.

DETAILED DESCRIPTION

Figure 1:
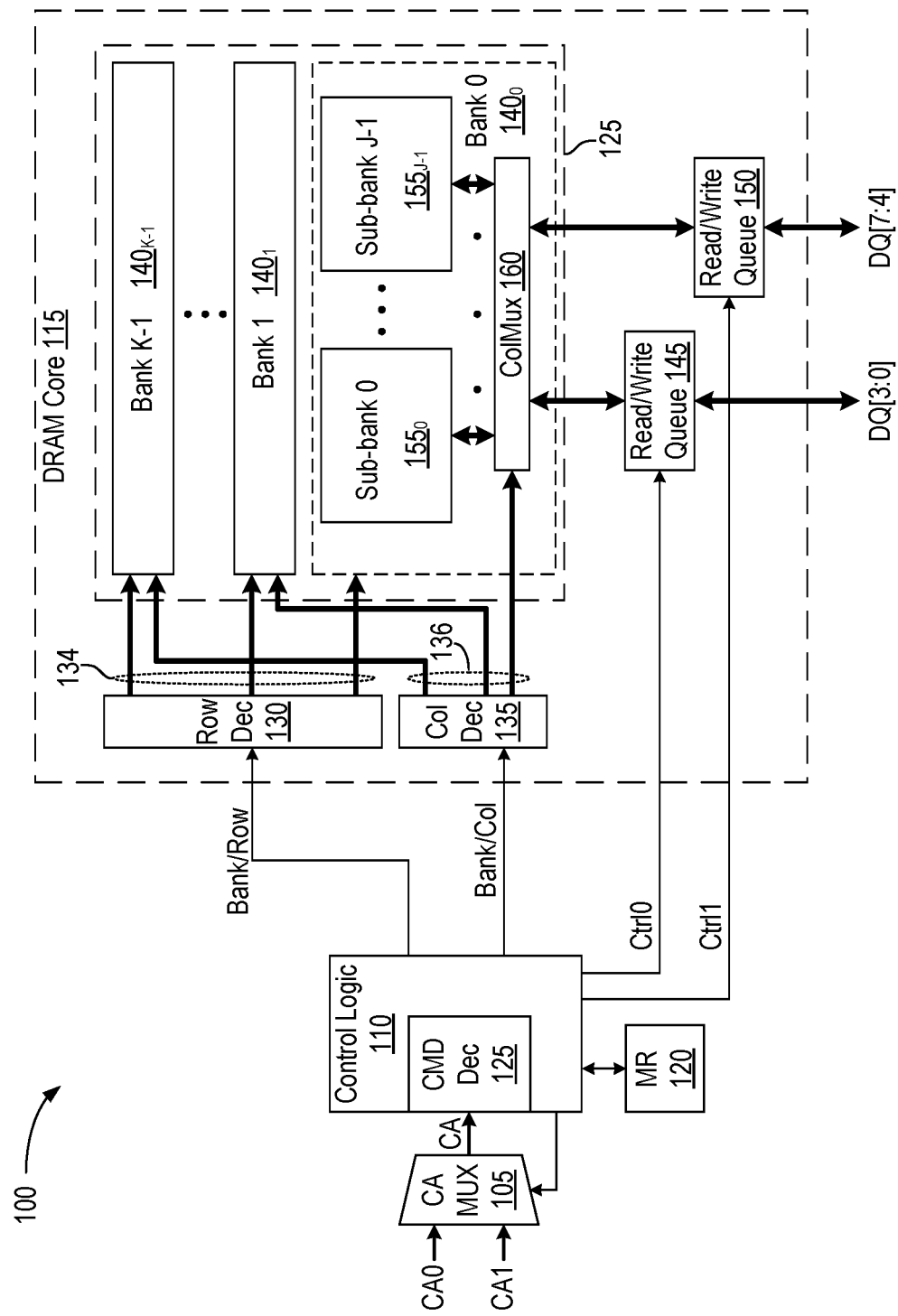
FIG. 1 depicts an embodiment of a memory device 100 having circuitry to support alternative command interfaces and variable data widths.

FIG. 1 depicts an embodiment of a memory device 100 having circuitry to support alternative command interfaces and variable data widths. This combination of features supports DPP memory topologies with little or no added complexity to the memory device. In the particular embodiment shown, and other embodiments disclosed herein, memory device 100 is a dynamic random access memory (DRAM) device that includes, among its component circuit blocks, a command multiplexer 105, control logic 110, and a DRAM core 115. Mode memory 120, in this instance a register coupled to control logic 110, stores a value that determines which of two command ports CA0 and CA1 is used to receive memory commands (e.g., read and write commands), and whether DRAM core 115 communicates four-bit-wide data or eight-bit-wide data.

Command multiplexer 105 directs commands received on one of two command ports CA0 and CA1 to a command decoder 125 within controller logic 110. Control logic 110 responds to decoded requests by issuing appropriately timed bank, row, and column address signals Bank/Row and Bank/Col, and control signals Ctrl0 and Ctrl1, to core 115.

Core 115 includes row and column address decoders 130 and 135, K memory banks 140[K-1:0], and a data interface with two four-bit read/write queues 145 and 150 that communicate data via respective ports DQ[3:0] and DQ[7:4]. Each bank 140, in turn, includes J sub-banks 155[J-1:0], each populated with rows and columns of memory cells (not shown), and a column multiplexer 160.

Control logic 110 and DRAM core 115 support memory functionality that is well understood by those of skill in the art. Briefly, control logic 110 decodes incoming commands and issues control and timing signals to core 115 to carry out the requested operation. For example, control logic 110 can send row address, bank address and control information to row decoder 130 in response to a row-activation command, and column address, bank address and control information to column decoder 135 and control signals to data queues 145 and 150 in response to a column-access command. Data can be read from or written to core 115 via one or both of ports DQ[3:0] and DQ[7:4] responsive to these signals.

DRAM core 115 is data-width programmable, responsive to the value stored in register 120 in this example, to communicate either four-bit-wide data on either one of ports DQ[3:0] and DQ[7:4], or eight-bit-wide data simultaneously on both. In the eight-bit configuration, control logic 110 enables both of queues 145 and 150 and the addressing provided to column decoder 135 causes column multiplexer 160 to communicate eight bits in parallel from two or more sub-banks. In the four-bit configuration, control logic 110 enables one of queues 145 and 150, and halves the number of sub-banks used for data access. Halving the number of sub-banks reduces the power required for, e.g., row activation, and consequently reduces power consumption. Other embodiments support more and different data widths.

Register 120 also controls command multiplexer 105 to determine whether commands are directed to decoder 125 via command interface CA from command port CA0 or command port CA1 As detailed below, the provision for a selection between multiple command ports supports DPP connections with minimal added circuit complexity. Memory systems populated with memory devices 100 thus provide the performance of point-to-point connections without sacrificing the flexibility of multi-drop bus architectures.

Register 120 can be loaded at start-up to store a value indicative of data width and the selected command port. Register 120 can be implemented using a programmable configuration register or other volatile circuitry, or by nonvolatile circuitry such as a one-time-programmable elements (e.g., fuse-controlled logic), floating-gate devices or any other nonvolatile storage. In other embodiments memory width and one of the command ports can be selected differently, such as by the use of a control pin or other types of configuration interfaces.

Figure 2:
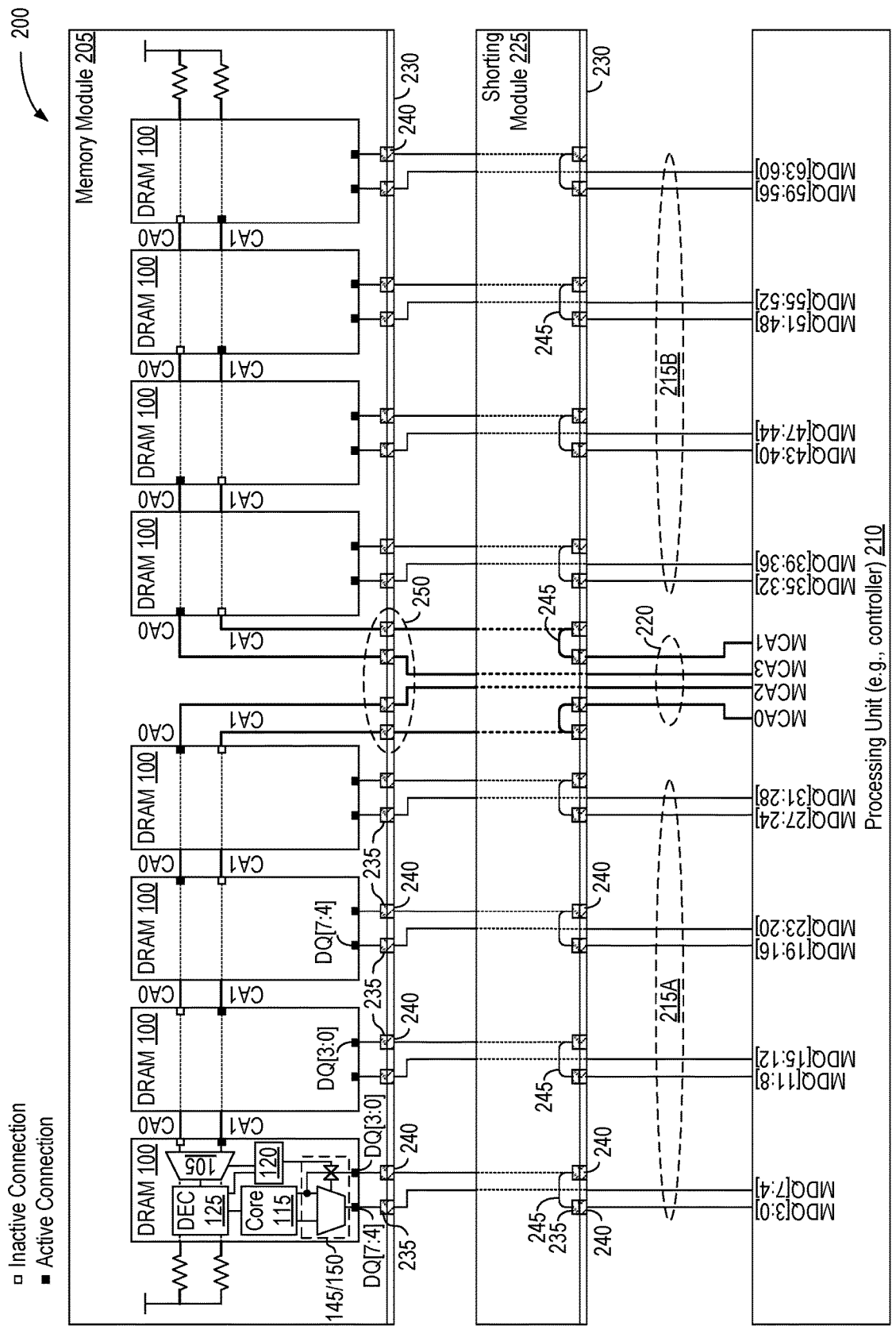
FIG. 2 depicts a memory system 200 in which a single memory module 205 populated with eight memory devices 100 of the type detailed in connection with FIG. 1 is connected to a processing unit (PU) 210 via a sixty-four-bit data interconnect 215A/B and a command interconnect 220 and a shorting module 225.

FIG. 2 depicts a memory system 200 in which a single memory module 205 populated with eight memory devices 100 of the type detailed in connection with FIG. 1 is connected to a processing unit (PU) 210 via a sixty-four-bit data interconnect 215A/B, a command interconnect 220, and a shorting module 225. PU 210 may be, e.g., a memory controller or a central processing unit that supports memory-control functionality. Memory module 205 and shorting module 225 are installed in respective module connectors 230 so that module pads 235 establish electrical connections to connector pads 240, and consequently to interconnects 215 and 220.

The mode register 120 in each memory 100 is programmed such that queues 145 and 150 (FIG. 1), functionally depicted in FIG. 2 as a multiplexer and pass gate, communicate eight-bit-wide data DQ[7:0]. In the example at the upper left, register 120 is set to receive commands via interface CA1 and to communicate data on both four-bit data ports DQ[3:0] and DQ[7:4]. Port DQ[7:4] is connected directly to a module data port MDQ[7:4] on PU 210 via four signal conductors of data interconnect 215A. Port DQ[3:0] is also connected to a module data port MDQ[3:0] on PU 210 via four signal conductors within interconnect 215A, but this connection is made via jumpers 245 on shorting module 225. The remaining seven memory devices 100 are likewise connected to PU 210 via corresponding collections of conductors.

PU 210 has four command ports, each of which directs commands to two of the eight available memory devices 100. Registers 120 in four of the eight memory devices 100 are programmed such that their respective command multiplexer 105 selects command port CA1; the remaining four memory device 100 are programmed to receive commands via port CA0. Programming can be accomplished using a mode-register command directed to a default command address on each memory device, with a mode register value for each memory device conveyed on subset of the module data ports. Each memory device could thus configure itself responsive to an appropriate register value and thereafter communicate commands and data on the selected connection resources. In other embodiments the command and data signal paths can be selected using other means, such as by programming fusable, flashable, or electrically programmable registers, or by selecting appropriate jumper settings.

In the example of FIG. 2, darkened and hollow squares on the periphery of each memory device 100 indicate active and inactive ports, respectively. Interfaces MCA0 and MCA2 connect to respective command ports CA1 and CA0 of the leftmost four memory devices 100; interfaces MCA1 and MCA3 connect to respective command ports CA1 and CA0 of the rightmost four memory devices 100. The connections for interfaces MCA0 and MCA1 are made via jumpers 245 on shorting module 225. The single installed module 205 thus provides 64-bit data responsive to commands on four available module command ports 250.

The provision of multiple command interfaces MCA[3:0] allows PU 210 to independently control fractions of memory devices 100, sets of two in this example. This technique, sometimes referred to as "threading," allows PU 210 to divide memory interconnect 215A/B into four sub-channels that convey relatively narrow memory "threads." Support for memory threading allows PU 210 to reduce access granularity where appropriate, and consequently reduce power consumption for memory accesses narrower than 64-bits.

Figure 3:
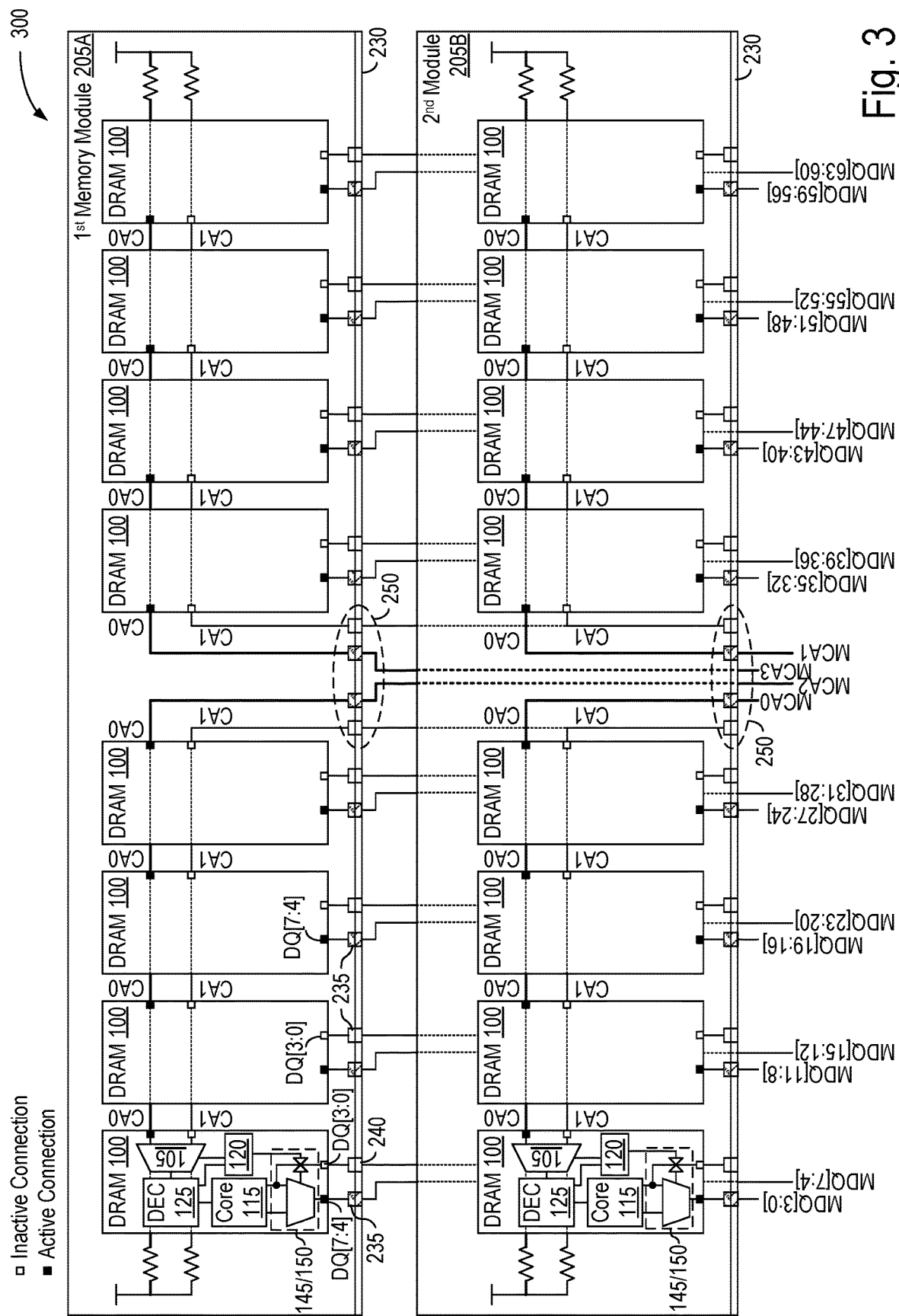
FIG. 3 depicts a memory system 300 similar to system 200 of FIG. 2 but with two memory modules 205A and 205B populating connectors 230.

FIG. 3 depicts a memory system 300 similar to system 200 of FIG. 2 but with two memory modules 205A and 205B populating connectors 230. Each of modules 205A and 205B is identical to module 200 of FIG. 2, but for the configuration of the constituent memory devices 100. PU 210 is omitted for ease of illustration.

Absent shorting module 225, module command interfaces MCA0 and MCA1 do not connect to module 205A; rather, traces on module 205B connect each of command interfaces MCA0 and MCA1 to a respective half of memory devices 100 on module 205B via their device command ports CA0. Every memory device 100 on both modules 205A and 205B is configured to be four-bits wide to communicate four-bit-wide data via respective module data-bus lines responsive to commands on their respective command port CA0. The two half-width modules 205A and 205B provide twice the storage space of one module.

As in the single-module example of FIG. 2, the data and command interfaces from the processing unit are fully utilized, the four command interfaces MCA[3:0] facilitate independent control of four subsets of memory devices 100, and memory interconnect 215A/B is divided into four sub-channels that convey relatively narrow memory "threads." The processing unit, connectors 230, and the board traces that extend between them are not modified to facilitate this extension. Further, the flexibility to provide either one or two modules comes without the need for multiple drops on the system data interface (command is multi-drop on each module).

Figure 4:
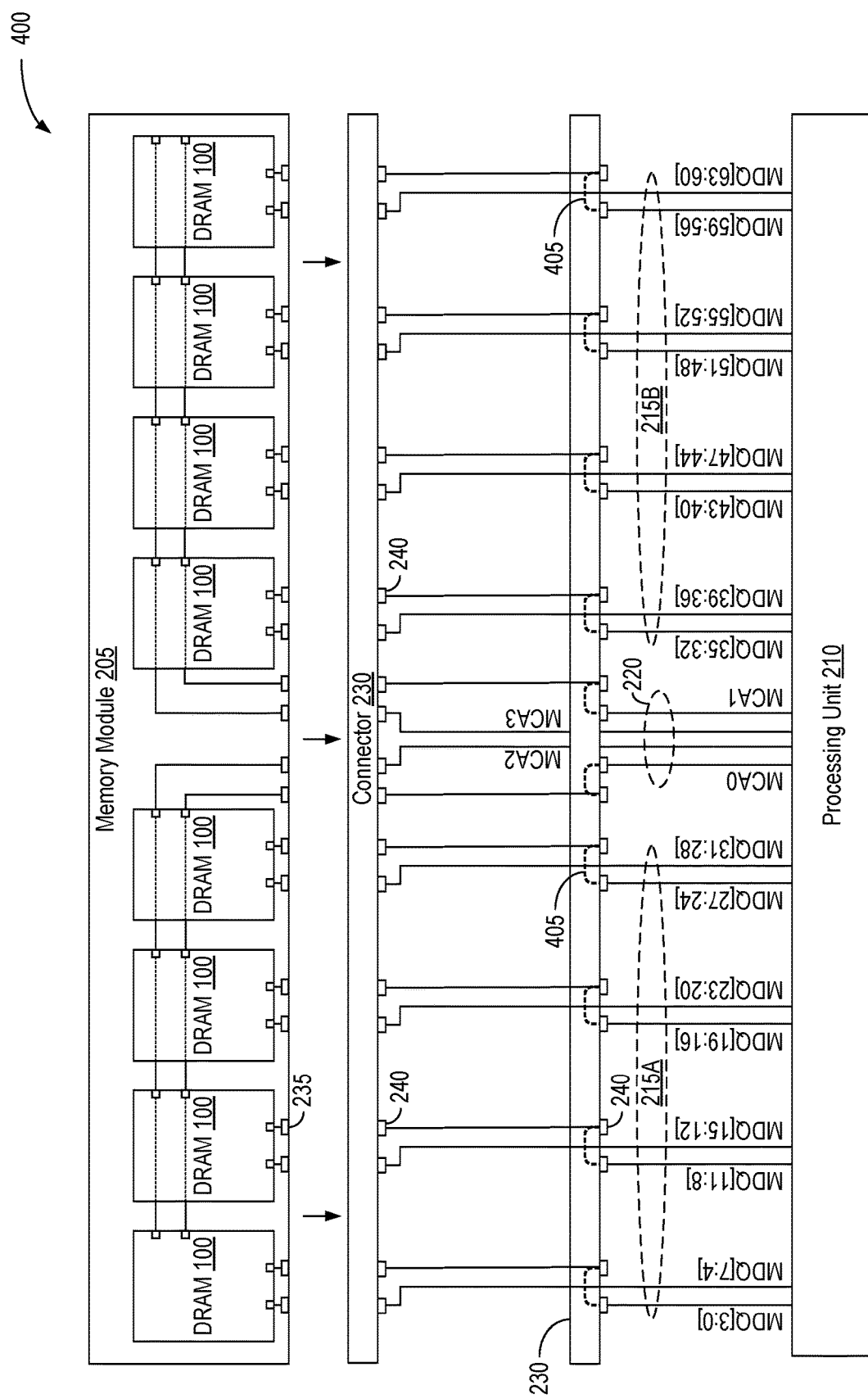
FIG. 4 is a plan view of a memory system 400 in accordance with one embodiment similar to systems 200 and 300 of FIGS. 2 and 3.

FIG. 4 is a plan view of a memory system 400 in accordance with one embodiment similar to systems 200 and 300 of FIGS. 2 and 3, with like-identified elements being the same or similar. Circuit details are omitted so as not to obscure the signal interconnect system provided by command and data interconnects 220 and 215 and connectors 230. This system utilizes point-to-point signaling in a way that permits maximum utilization of existing signal lines while accommodating different numbers of memory modules. Connectors 230, processing unit 210, and the interconnecting traces that pass data and command signals are on and within a printed-circuit board (PCB), such as a computer motherboard or system backplane. Connectors 230 are, e.g., memory-module sockets that receive and support installable/removable memory modules 205. As noted previously, one of connectors 230 can receive a shorting module that forwards signals between processing unit 210 and the other connector 230. A shorting connector can be used in lieu of a shorting module in other embodiments. A shorting connector might establish jumper connections 405 absent an installed module, for example. Module connectivity can also be modified using, e.g., other forms of programmable interfaces on or integrated with the PCB.

While the foregoing embodiments support either two or four threads per module, other embodiments can support other more or different combinations. With reference to the single- or dual-module configurations of FIGS. 2 and 3, for example, similar embodiments can include additional connectors and more complex interface routing to support higher numbers of modules while maintaining point-to-point connectivity. In an embodiment in which each memory device can be configured to have a width of two, for example, each of four modules can be configured to communicate 16-bit data responsive to one of command interfaces MCA[3:0]. The two half-width modules 205A and 205B provide twice the storage space of one module. In such embodiments the four command interfaces MCA[3:0] facilitate independent control of four subsets of memory devices, as in the prior examples, to divide the interconnect into four sub-channels that convey module threads.

Figure 5:
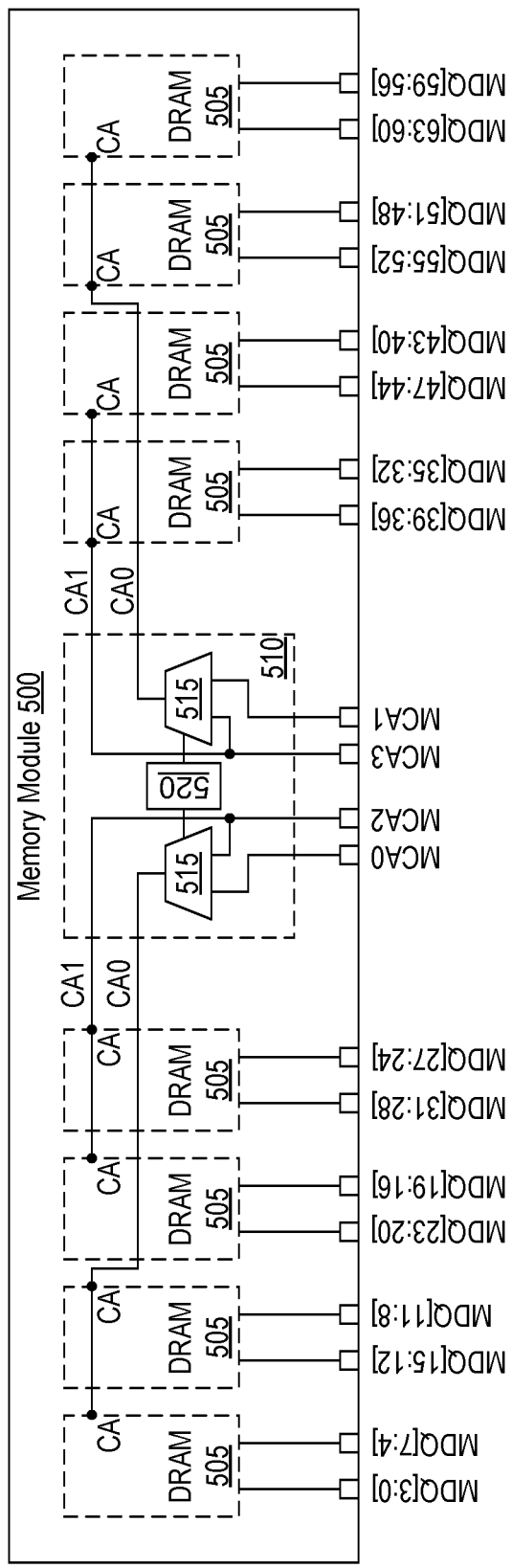
FIG. 5 depicts a memory module 500 in accordance with another embodiment.

FIG. 5 depicts a memory module 500 in accordance with another embodiment. Module 500 includes eight variable-width memory devices 505 and a configurable command buffer 510. Memory devices 505 lack command multiplexer 105, but module 500 nevertheless provides command-bus routing in support of DPP connectivity in the manner detailed above.

Each memory device 505 may be as detailed in connection FIG. 1 but for the omission of command multiplexer 105. That is, each memory device 505 has but one command port CA. Configurable buffer 510 includes a pair of command multiplexers 515 controlled by a programmable register 520. In a single-module configuration, similar to that illustrated in FIG. 2, multiplexers 515 connect command interfaces MCA0 and MCA1 to the respective left- and right-side command busses CA0. In the dual-module configuration, similar to that illustrated in FIG. 3, multiplexers 515 connect command interfaces MCA2 and MCA3 to the respective left- and right-side command busses CA0. Providing the requisite command steering in buffer 510 simplifies the design of memory devices 505. Buffered memory modules provide additional functionality, including to route and buffer commands and data between a memory controller and the memory devices.

Memory devices 505 are width-configurable in this embodiment. In other embodiments buffer 510 can selectively combine fixed or variable-width memory devices to support width configurability. For example, two four-bit-wide memory die can be controlled separately to communicate four-bit-wide data, or together to communicate eight-bit-wide data.

While the present invention has been described in connection with specific embodiments, after reading this disclosure, variations of these embodiments will be apparent to those of ordinary skill in the art. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. A memory controller to control memory devices disposed on a memory module, the memory devices each having a selectable first command port and a selectable second command port, the memory controller comprising:
   a first data port to communicate first data;
   a second data port to communicate second data;
   circuitry to configure:
      the memory devices to communicate with one of the first data port and the second data port in a narrow-data mode and with both of the first data port and the second data port in a wide-data mode;
      a first subset of the memory devices to receive first commands via first command ports at each respective memory device in the first subset of the memory devices; and
      a second subset of the memory devices to receive second commands via second command ports at each respective memory device in the second subset of the memory devices; and
   a first command interface to connect to the first command port of each memory device of the first subset of the memory devices; and
   a second command interface to connect to the second command port of each memory device of the second subset of the memory devices.

2. The memory controller of claim 1, the circuitry to configure the first subset of the memory devices to receive the first commands via the first command ports at each respective memory device in the first subset of the memory devices and the second subset of the memory devices to receive the second commands via the second command ports at each respective memory device in the second subset of the memory devices in the narrow-data mode.

3. The memory controller of claim 2, the circuitry to configure both the first subset of the memory devices and the second subset of the memory devices to received third command via the first command ports in the wide data mode.

4. The memory controller of claim 1, each memory device having mode memory to select between the first command port and the second command port, the memory controller to issue a mode command to each of the memory devices to load the mode memories.

5. The memory controller of claim 4, the mode memory to select between the narrow data mode and the wide data mode.

6. The memory controller of claim 5, wherein the mode command loads a value in the mode memory to select between the narrow-data mode and the wide-data mode.

7. The memory controller of claim 1, the first command interface to connect to the first command ports via a second module.

8. The memory controller of claim 7, the second command interface to connect to the second command ports bypassing the second module.

9. The memory controller of claim 1, the memory controller to control second memory devices disposed on a second memory module, the second memory devices each having a selectable third command port and a selectable fourth command port.

10. The memory controller of claim 9, the circuitry to configure a third subset of the memory devices on the second memory module to receive third commands via the third command ports and to configure a fourth subset of the memory devices to receive fourth commands via the fourth command ports.

11. The memory controller of claim 10, further comprising:
   a third command interface to connect to the third command port of each memory device of the third subset of the memory devices; and a fourth command interface to connect to the fourth command port of each memory device of the fourth subset of the memory devices.

12. A method of communicating memory commends and data to memory devices on a memory module, method comprising:
   issuing at least one mode command to each of the memory devices, the at least one mode command instructing each of the memory devices to:
      select one of a first command port and a second command port to receive memory commands; and
      select either one or both of a first data port and a second data port to communicate data responsive to the memory commands.

13. The method of claim 12, wherein the at least one mode command loads a mode memory in each of the memory devices.

14. The method of claim 12, wherein the at least one mode command instructs a first subset of the memory devices to select the first command port and a second subset of the memory devices to select the second command port.

15. The method of claim 14, wherein the at least one mode command instructs both the first subset of the memory devices and the second subset of the memory devices to communicate the data via both of the first data port and the second data port responsive to the memory commands.

16. The method of claim 14, wherein the at least one mode command instructs both the first subset of the memory devices and the second subset of the memory devices to communicate the data via both of the first data port and the second data port responsive to each of the memory commands.

17. The method of claim 12, wherein the at least one mode command instructs the memory devices a to select the same one of the first command port and the second command port.

18. The method of claim 17, wherein the at least one mode command instructs the memory devices to communicate the data via only one of the first data port and the second data port responsive to the memory commands.

19. A memory controller for communicating with memory devices, the memory controller comprising:
   an interface for communicating commands and data to the memory devices; and
   means for issuing at least one mode command to each of the memory devices via the interface, the at least one mode command instructing each of the memory devices to:
      select one of a first command port and a second command port to receive memory commands; and
      select either one or both of a first data port and a second data port to communicate data responsive to the memory commands.

20. The memory controller of claim 19, wherein the at least one mode command instructs a first subset of the memory devices to select the first command port and a second subset of the memory devices to select the second command port.

* * * * *